United States Patent [19]

Denton et al.

[11] 4,395,323

[45] Jul. 26, 1983

[54] APPARATUS FOR IMPROVING A SPUTTERING PROCESS

[75] Inventors: Richard A. Denton, Marlton; Bawa Singh, Cherry Hill, both of N.J.

[73] Assignee: Denton Vacuum Inc., Cherry Hill, N.J.

[21] Appl. No.: 257,314

[22] Filed: Apr. 17, 1981

[51] Int. Cl.³ .............................................. C23C 15/00
[52] U.S. Cl. ................................ 204/298; 204/192 R; 204/192 SP; 204/192 M
[58] Field of Search ............ 204/298, 192 M, 192 SP, 204/192 R

[56] References Cited

U.S. PATENT DOCUMENTS 3,526,584  9/1970  Shaw .................................... 204/298
3,897,325  7/1975  Aoshima et al. ..................... 204/298
4,006,073  2/1977  Welch ............................ 204/192 SP
4,166,018  8/1979  Chapin ................................. 204/298

Primary Examiner—Veronica O'Keefe
Attorney, Agent, or Firm—William E. Cleaver

[57] ABSTRACT

The present invention provides, in a sputtering apparatus, an anode means interposed between the cathode and the substrate (upon which material is to be deposited) which acts to intercept electrons so that they do not impinge on the substrate and which is formed to permit the material dislodged from the cathode (by impinging ions) to pass beyond the anode and be deposited on the substrate. While the present invention can be usefully employed without the aid of a magnetic field, in a preferred embodiment, the present invention is made part of a planar magnetron.

6 Claims, 5 Drawing Figures

APPARATUS FOR IMPROVING A SPUTTERING PROCESS

BACKGROUND

The present invention is related to a sputtering process which is a technique whereby the small quantity of gas remaining in an evacuated (vacuum) chamber is placed in an electrical glow discharge state by electrical current (using the gas as a conductive path) passing from one electrode to another electrode within the vacuum chamber. In a preferred embodiment of the sputtering art, the voltage applied to the electrodes is a direct current (d.c.) voltage and therefore one of the electrodes becomes the cathode and the other electrode becomes the anode. The electrical glow discharge produces a large number of electrons and a large number of ions. The electrons of course, in accordance with the laws of physics, travel, or attempt to travel, toward the anode, while the ions travel, or attempt to travel, toward the cathode. A relatively high voltage difference is required across the electrodes to effect the gaseous glow discharge phenomenon. Accordingly the ions impinging upon the cathode do so with considerable momentum and dislodge atoms (particles) of cathode material from the cathode. The atoms or particles of the cathode material are ejected into the plasma and migrate throughout the vacuum chamber. These moving particles coat, or are deposited on, whatever surfaces they strike and such surfaces include the substrate and the anode.

While we are principally considering a d.c. sputtering technique, it should be noted that sputtering has been effected with an alternating current (a.c.) applied voltage at radio frequencies (RF). An a.c. voltage technique has some advantages such as the ability to sputter or deposit dielectric materials. However the a.c. technique has disadvantages as well, such as the necessity to provide impedance matching.

As the sputtering art developed it was discovered that the voltage difference required to start the gaseous glow discharge could be reduced and the number of ions for a given applied power could be increased (thereby reducing the coating time) by employing a magnetic field oriented to lie between 45° to 90° with respect to the electric field developed between the cathode and the anode. Further developments included using a planar plate, of the material to be deposited, (therefore as the cathode) in combination with magnetic pole pieces secured thereto. The magnetic field provided by the magnetic pole pieces effect an electron trap at and near the surface of the cathode which is being bombarded by the ions from the gaseous glow discharge. In this configuration the anode is located around the perimeter of the planar cathode and this arrangement will be referred to throughout this description as the perimeter anode arrangement. The electron trap technique greatly improves the rate of ionization and accordingly the rate of sputtering.

In all of the foregoing techniques very little consideration was given to the electron bombardment of the substrate to be coated. The electron impingement of a substrate can be undesirable, particularly if the substrate can be damaged by heat and/or radiation. It is true that using the magnetron mitigates the damage done by electron impingement because the electrons are initially confined by the magnetic field and the ratio of deposited material to electrons striking the substrate is higher than without the use of the magnetron. Nonetheless when the electrons pass outside of the magnetic field or electron trap (created by the flux of the magnets employed) there has been no effort to keep such electrons from striking the substrate. This problem is particularly acute when the substrates are dielectric specimens which are to be examined with scanning electron microscopes. The very fine detail of such a specimen is frequently lost if too much heat is generated or too much radiation is in effect as the result of electron impingement. The present invention provides a means to reduce the electron bombardment of the substrate while permitting a very high percentage of the dislodged cathode material to be deposited on the substrate.

SUMMARY

The present invention employs an anode made up of wires that are disposed substantially orthogonal to one another to form a mesh and which are disposed with respect to one another such that the voids or holes in the mesh are relatively large compared to the cross section of the wire making up the mesh. The anode assembly (wire mesh configuration held within a frame) is located between a planar cathode and a substrate. This configuration of cathode, anode and substrate is located in a vacuum chamber and is employed as part of a sputtering device to enable material from the cathode to be deposited on the substrate. A voltage difference is applied between the cathode and anode which causes the small amount of gas in the vacuum chamber to "break down" in a gaseous glow discharge thereby providing an abundance of ions and electrons. The ions impinge on the cathode thereby dislodging cathode material i.e. particles to be deposited on the substrate, while the electrons are attracted to the anode, whereat something greater than 90% are intercepted, thereby completing the circuit. The particles pass through the voids of the anode and come to rest on the substrate. In a preferred embodiment a magnetic field is developed at the cathode which initially traps the electrons and provides more collisions within the gaseous discharge to thereby provide more ions. The increased ions dislodge more cathode material particles and hence the rate of sputtering is improved. By intercepting the vast majority of electrons at the mesh anode, the substrate is not "bombarded" by electrons and hence damage done to the substrate by heat or radiation from electron impingement is minimized.

The objects and features of the present invention will be better understood from the following description taken in conjunction with the drawings in which.

Throughout this description when we discuss the percentage of cathode material which is deposited on the substrate or we discuss the percentage of electrons which bombard the substrate we are comparing those amounts with the amounts which are present under the perimeter anode arrangement, these latter amounts being defined as 100%. For instance, as mentioned below, in a described operation 90% of the cathode material which gets deposited under the perimeter anode arrangement gets deposited in accordance with the described embodiment of the present invention and 92% of all (the 100% reference) of the electrons which are permitted to bombard the substrate under the perimeter anode arrangement are intercepted in accordance with the below described arrangement of the present invention.

Figure 1:
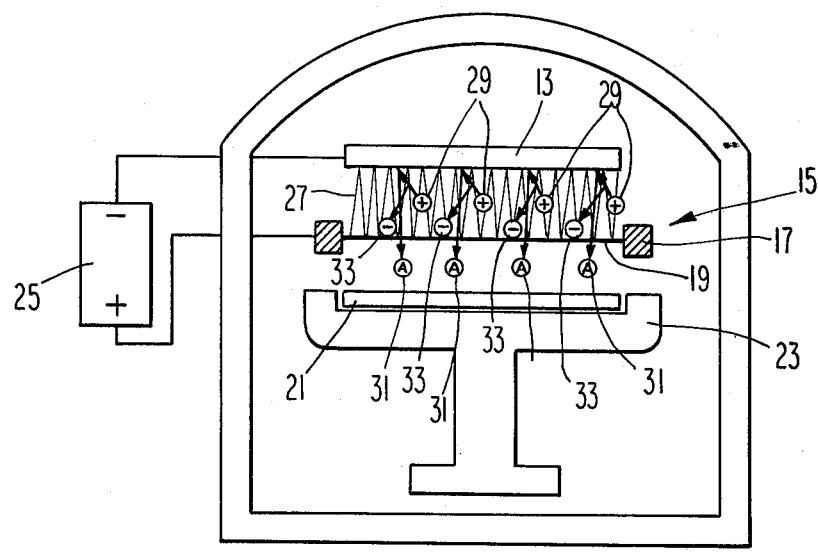
FIG. 1 depicts the present invention employed with a d.c. field sputtering device.
Figure 3:
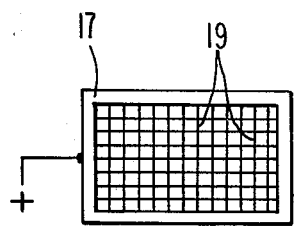
FIG. 3 shows the top view of one embodiment of a mesh anode.

Examine FIG. 1 which shows a vacuum chamber 11 in which there is located a planar cathode 13 and a wire mesh anode 15. The cathode can be formed of various metals such a gold, palladium, copper, suitable metal alloys, or the like. The wire mesh anode 15 comprises a frame member 17 with wires 19 disposed or strung therewithin. In FIG. 1 the frame member 17 is shown in cross section so that the wires 19 can be better appreciated. The arrangement of the frame member 17 and the wires 19 can be more fully understood from examining FIGS. 3 and 5. In the preferred embodiment the wires are made of 0.010 diameter stainless steel and the frame is made of stainless steel, although other materials may be used. It should be understood that the mesh can be formed by etching techniques or by punching out voids from a metal sheet. The voids need not be rectangularly shaped. The dimensions and relationships between the wires and the frame member are exaggerated in the Figures. It was determined after considerable experimentation that in a situation wherein gold was the cathode material, if a 10 mil diameter stainless steel wire were arranged in a mesh with ¼ inch spaces or voids therebetween and if a voltage difference of 500 volts were applied between the cathode and anode in a vacuum of 20 militorr, then over 90% of the dislodged cathode material i.e. particles of gold, reached the substrate surface and about 92% of the electrons were intercepted by the anode. The foregoing rates of deposition and electron interception are very favorable when compared with the perimeter anode device, i.e. wherein the anode is located around the periphery of the planar cathode. Other arrangements of different sized wires and different sized voids could be used depending on the cathode material, the vacuum value and the applied voltage difference.

If we consider FIG. 1 again we note that there is a substrate 21 located on the underside of the anode 15. The cathode 13 and the anode 15 are suitably mounted within the vacuum chamber by means not shown in order to simplify the drawings. The substrate 21 is held by a table means 23 although it should be understood that other suitable holding means for holding substrate 21 may be used. Neither the substrate 21 nor the substrate holder 23 is connected to a voltage source and can be considered as electrically "floating." As can be gleaned from FIG. 1, the cathode 13 and the anode 15 are connected to a d.c. source 25 which can be any form of a direct current energy source (such as a d.c. generator) which would provide the proper voltage to create a gaseous glow discharge between the anode 15 and the cathode 13. The gaseous glow discharge is depicted in FIG. 1 by the lines 27.

FIG. 1 also shows schematically the path of the ions 29 as they strike the cathode 13. The ions 29 strike the cathode 13 with considerable momentum and thereby dislodge particles of cathode material, such as the particles 31 depicted in FIG. 1. Further in FIG. 1 there are shown electrons 33 in a collision mode with the gas particles which in turn increases the number of ions present. In the apparatus shown in FIG. 1 the majority of the electrons 33 are intercepted by the positively charged mesh 19 although because the electrons are not impeded initially they very often approach the mesh with great velocity and some of them pass through the voids in the mesh to impinge upon the substrate. Be that as it may the arrangement of the structure of FIG. 1 is decided improvement over the peripherally located anode which has no mesh.

Figure 2:
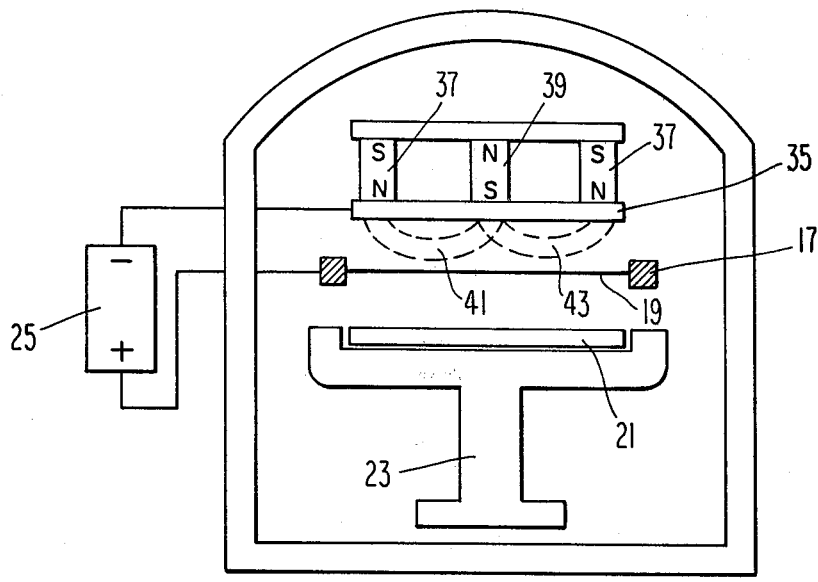
FIG. 2 depicts the present invention employed with a magnetron sputtering device.

FIG. 2 shows a planar cathode 35 upon which there are located two magnets or magnetic pole pieces 37 and 39. The arrangement of these pole pieces can be better understood by examining FIG. 4. The magnets 37 and 39 can be either permanent magnets or electromagnetic pieces. The flux arrays, 41 and 43 are respectively provided by the magnets 37 and 39. The magnets 37 and 39 are shown as being formed (see FIG. 4) to provide a continuous flux field, i.e., a continuous tunnel like pattern, it should be understood that a continuous tunnel like flux arrangement provides the best type of electron trap and can be employed with the structure of FIG. 2. Electrons travel in a helical pattern within a flux tunnel. The relatively long excursions of electrons within the electron trap, or flux tunnel, tend to provide for more collisions between electrons and gas particles thereby breaking loose more ions. The electrons leave the trap with less momentum than such electrons would have if there were no electron trap. Accordingly over 92% of the electrons leaving the traps 41 and 43 are intercepted by the mesh 19 which is charged positively and more ions are present than would be present without the use of the trap. Because of the increased number of collisions between electrons and gas particles there is an increased number of ions present. The increased number of ions bombard the cathode, dislodge more particles of cathode material and provide increased sputtering or deposition of cathode material on substrate 21.

Since the arrangement shown in FIG. 2 permits over 90% of the material dislodged to pass through the anode to be deposited on substrate 21, while at the same time intercepting over 92% of the electrons, it follows that the arrangement in FIG. 2 provides a very high rate of sputtering and minimal damage to the substrate from heat and/or radiation due to electron bombardment.

Figure 4:
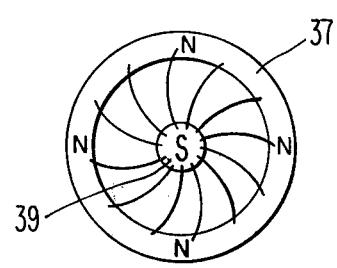
FIG. 4 shows the pole pieces of FIG. 2 as viewed from the anode side and without the cathode plate.
Figure 5:
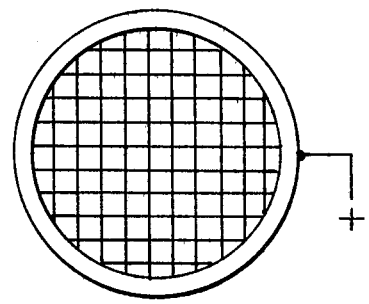
FIG. 5 shows a mesh anode circular form.

The mesh anode of FIG. 5 is formed to accommodate the pole piece arrangement of FIG. 4 although such a formation need not be used.

We claim:

1. In a sputtering device, the combination of: vacuum chamber means adapted to be in a substantial state of vacuum; planar cathode means disposed within said vacuum chamber means and comprising a material to be deposited on a substrate; electrical conducting means formed into a mesh like structure whereby said mesh like structure forms a mesh anode means; said mesh anode means disposed wihtin said vacuum chamber means in close proximity to said cathode means; electrical voltage generating means connected to both said cathode means and mesh anode means to provide a sufficient voltage difference therebetween to cause a gaseous glow discharge between said cathode means and said anode means; and substrate holding means characterized by being electrically floating and located in said vacuum chamber means on the side of said mesh anode means away from said cathode means and out of the gaseous glow discharge between said cathode and anode, whereby when said gaseous glow discharge is in effect, particles of cathode material are dislodged therefrom and pass through said mesh anode means to be deposited on said substrate means and whereby a majority of the electrons resulting from said gaseous glow discharge are intercepted by said mesh anode means.

2. A sputtering device according to claim 1 wherein said electrical conducting means is formed into a frame like structure which defines an enclosure and wherein there is further included a plurality of electrically conductive wires formed into a mesh and disposed to fill said enclosure and secured to said frame like structure whereby said frame like structure holding said wire mesh forms said mesh anode means.

3. A sputtering device according to claim 1 wherein there is further included first and second magnetic pole pieces secured to said planar cathode means and disposed thereon to form a tunnel of magnetic flux therebetween, which tunnel of magnetic flux lies between said cathode and said anode and wherein substantially all of the lines of said flux lie at 45° to 90° with respect to an electric field between said cathode and said anode.

4. A sputtering device according to claim 3 wherein said first pole piece is a continuous piece with an aperture in the center of the configuration that it defines and wherein said second magnetic pole piece is disposed within said last mentioned aperture and is formed to have a cross sectional dimension such that when located in said aperture there will be a gap between said first and second magnetic pole pieces.

5. A sputtering device according to claim 3 wherein said first magnetic pole piece is formed in a circle like configuration and said second magnetic pole piece is formed as a rod and is located within the circle configuration of said first magnetic pole piece.

6. A sputtering device according to claim 3 wherein said electrical conducting means is formed into a circle like structure having approximately the same diameter as said first pole piece.

* * * * *